United States Patent
Stroet

(10) Patent No.: US 9,306,531 B2
(45) Date of Patent: Apr. 5, 2016

(54) EXPONENTIAL ROM TABLE TUNING USING TRIM FOR FREQUENCY AGILE ANALOG FILTERS

(71) Applicant: Linear Technology Corporation, Milpitas, CA (US)

(72) Inventor: Petrus Martinus Stroet, Santa Cruz, CA (US)

(73) Assignee: Linear Technology Corporation, Milpitas, CA (US)

( * ) Notice: Subject to any disclaimer, the term of this patent is extended or adjusted under 35 U.S.C. 154(b) by 99 days.

(21) Appl. No.: 14/199,839

(22) Filed: Mar. 6, 2014

(65) Prior Publication Data

US 2015/0256142 A1    Sep. 10, 2015

(51) Int. Cl.
   *H03H 7/03* (2006.01)
   *H03H 7/01* (2006.01)

(52) U.S. Cl.
   CPC .............. *H03H 7/0138* (2013.01); *H03H 7/03* (2013.01)

(58) Field of Classification Search
   CPC ........ H03H 7/03; H03H 7/0138; H03H 7/153
   See application file for complete search history.

(56) References Cited

U.S. PATENT DOCUMENTS

| | | | |
|---|---|---|---|
| 3,714,588 A | | 1/1973 | Deboo et al. |
| 3,978,420 A | | 8/1976 | Lane |
| 4,510,454 A | * | 4/1985 | Sherman ........................ 330/2 |
| 5,179,726 A | * | 1/1993 | Moon ........................ 455/180.4 |
| 5,281,931 A | * | 1/1994 | Bailey et al. ................. 333/17.1 |
| 6,151,238 A | * | 11/2000 | Smit et al. ....................... 365/96 |
| 6,559,714 B2 | * | 5/2003 | Park et al. ...................... 327/553 |
| 6,778,023 B2 | * | 8/2004 | Christensen .................... 331/16 |
| 7,002,404 B2 | * | 2/2006 | Gaggl et al. .................. 327/553 |
| 7,019,586 B2 | * | 3/2006 | Dong ............................. 327/553 |
| 7,065,337 B2 | * | 6/2006 | Cowley et al. ................ 455/266 |
| 7,400,212 B1 | | 7/2008 | Vishinsky |
| 7,570,207 B2 | * | 8/2009 | Kimura .................... 342/357.63 |
| 7,801,296 B2 | * | 9/2010 | Barkaro et al. ............... 379/395 |
| 2008/0094133 A1 | | 4/2008 | Lim et al. |
| 2008/0258806 A1 | * | 10/2008 | Youssoufian et al. ......... 327/553 |
| 2011/0128071 A1 | * | 6/2011 | Fukusen et al. ............... 327/554 |

OTHER PUBLICATIONS

Texas Instruments Inc. 2010. LO Harmonic Effects on I/Q Balance and Sideband Suppression in Complex I/Q Modulators, Application Report, SLWA059-May 2010, 16 pages.

* cited by examiner

*Primary Examiner* — Thomas J Hiltunen
(74) *Attorney, Agent, or Firm* — McDermott Will & Emery LLP

(57) ABSTRACT

A tunable and trimmable analog filter may include a tunable analog filter and a trimming circuit. The tunable analog filter may set the frequency of a characteristic of the tunable analog filter based on a digital tuning signal that is indicative of a desired frequency of the characteristic. However, the tunable analog filter may contain components having values that deviate from specified values due to var during manufacture of the tunable analog filter. The value deviations can cause the frequency of the characteristic not to precisely match the frequency indicated by the digital tuning signal. The trimming circuit may include a non-volatile memory that contains data. The trimming circuit may receive tuning information indicative of a desired frequency for the characteristic of the tunable analog filter. The trimming circuit may generate the digital tuning signal by trimming the tuning information to compensate for the deviations in component value and by using the data contained within the non-volatile digital memory.

21 Claims, 3 Drawing Sheets

EXPONENTIAL ROM TABLE TUNING USING TRIM FOR FREQUENCY AGILE ANALOG FILTERS

BACKGROUND

1. Technical Field

This disclosure relates to analog filters that are tunable to a desired frequency and to deviations in the value of components in each instance of the same filter due to process variations during their manufacture.

2. Description of Related Art

On-chip analog filters may be tunable over a wide frequency range based on a digital tuning signal that is indicative of a frequency of a desired filter characteristic, such as a desired center or cut-off frequency. This degree of tuning that is done in response to various digital tuning signals may need to be calibrated due to deviations in the value of components in the analog filter caused by process variations during its manufacture, such as deviations in the values of resistors, capacitors, and/or inductors.

Trim values can be applied to correct for these component value deviations. However, the trim needed for some tunable analog filters, such as binary-weighted tunable analog filters, may depend upon the desired frequency setting. The need to have different trim values for different frequency settings can add considerable complexities and costs.

SUMMARY

A tunable and trimmable analog filter may include a tunable analog filter and a trimming circuit. The tunable analog filter may set the frequency of a characteristic of the tunable analog filter based on a digital tuning signal that is indicative of a desired frequency of the characteristic. However, the tunable analog filter may contain components having values that deviate from specified values due to variations during manufacture of the tunable analog filter. The value deviations can cause the frequency of the characteristic not to precisely match the frequency indicated by the digital tuning signal. The trimming circuit may include a non-volatile memory that contains data. The trimming circuit may receive tuning information indicative of a desired frequency for the characteristic of the tunable analog filter. The trimming circuit may generate the digital tuning signal by trimming the tuning information to compensate for the deviations in component values and by using the data contained within the non-volatile digital memory.

The characteristic of the tunable analog filter may be a frequency cutoff point or center point.

The non-volatile digital memory may include an input and an output. The data may cause the output to substantially be an exponential function of its input.

The trimming circuit may include a summer that sums the tuning information with a fixed trim value.

The non-volatile digital memory may be a first non-volatile digital memory and the trimming circuit may include a second non-volatile digital memory containing the fixed trim value.

The fixed trim value may be frequency-independent.

The second non-volatile digital memory may have burnable fuses and the fixed trim value may be represented by the states of the burnable fuses.

The summer may have an output whose value is delivered to the input of the first non-volatile digital memory.

The first non-volatile digital memory may contain data that may or may not include a trim value for every possible input value.

The tunable analog filter may be an RC filter. The tuning information may be based on the natural logarithm of a constant divided by the desired frequency.

The tunable analog filter may be an LC filter. The tuning information may be based on the natural logarithm of the square of the result of a constant divided by the desired frequency.

The tunable analog filter may be a C/gm filter. The tuning information may be based on the natural logarithm of a constant divided by the desired frequency.

The tunable analog filter may be a binary-weighted tunable analog filter.

The tunable analog filter may be a poly-phase tunable analog filter. The poly-phase tunable analog filter may have a CppI input that receives a CppI digital tuning signal that causes the frequency of a CppI characteristic of the tunable analog filter to be set by the CppI digital tuning signal that is indicative of the frequency of the characteristic. The poly-phase tunable analog filter may have a CppQ input that receives a CppQ digital tuning signal that causes the frequency of a CppQ characteristic of the tunable analog filter to be set by the CppQ digital tuning signal that is indicative of the frequency of the characteristic. The trimming circuit may generate the CppI and the CppQ digital tuning signals by trimming the tuning information to compensate for the deviations in component value and by using the data contained within the non-volatile digital memory. Having different digital tuning signals CppI and CppQ may allow for a phase tuning described in the patent application "Poly-Phase Filter with Phase Tuning," filed Apr. 17, 2013, application 61/813,077.

There may be multiple tunable and trimmable analog filters. Each may contain the same circuitry and may include a tunable analog filter and a trimming circuit. Each tunable analog filter may set the frequency of a characteristic of the tunable analog filter based on a digital tuning signal that is indicative of the frequency of the characteristic. Each tunable analog filter may contain components having values that vary from specified values due to variations during manufacture of the tunable analog filter, the value deviations causing the frequency of the characteristic not to precisely match the frequency indicated by the digital tuning signal. Each trimming circuit may include a first non-volatile digital memory that includes an input and an output and contains data that causes the output to substantially be an exponential function of its input. Each tunable analog filter may include a second non-volatile digital memory containing a fixed trim value. Each tunable analog filter may receive tuning information indicative of a desired frequency for the characteristic of the tunable analog filter, and generate the digital tuning signal by trimming the tuning information to compensate for the deviations in component values based on the tuning information, the fixed trim value, and the data contained within the first non-volatile digital memory. The data in each of the first non-volatile digital memories may be the same. The fixed trim value in each of the second non-volatile digital memories may be different.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
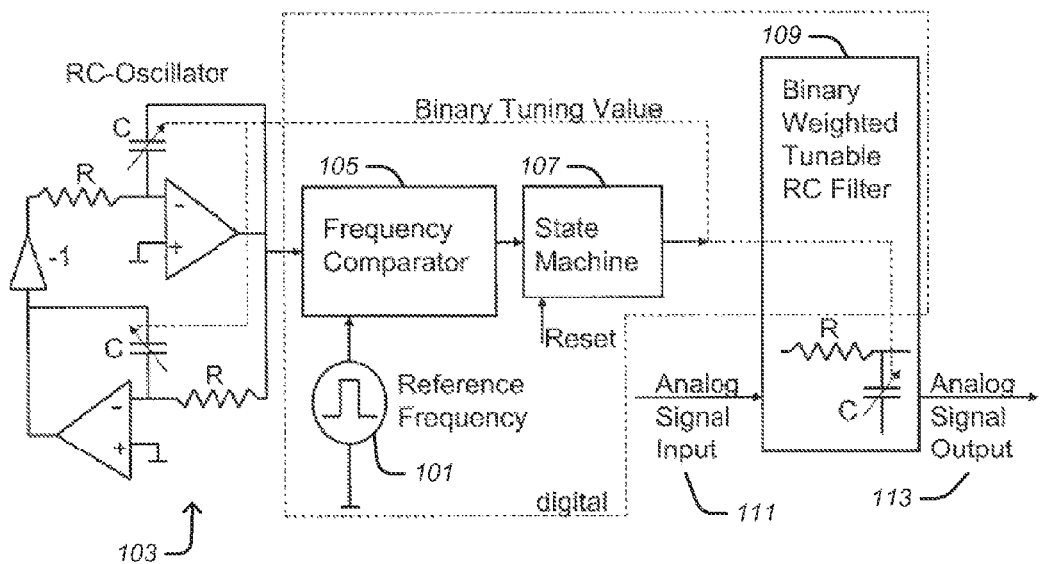
FIG. 1 illustrates an example of a prior art tunable analog filter.

FIG. 1 illustrates an example of a prior art tunable analog filter. This prior art tunable analog filter includes a frequency reference 101, an RC-oscillator 103, a frequency comparator 105, a state machine 107, a binary weighted tunable RC filter 109 that tunes its cutoff frequency to the frequency indicated by a binary tuning value, and an analog signal input 111 to and an analog signal output 113 from the binary weighted tunable RC filter 109.

After a reset is given to the state machine, the binary tuning value is counted up until the output of the frequency comparator has changed state, signaling that the optimum binary tuning value has been reached. The capacitors and resistors of the RC-oscillator 103 and the binary weighted tunable RC filter are part of the same chip. All of the resistors and capacitors within a single chip are subject to substantially the same variations during the manufacturing process. The RC-oscillator 103 may sometimes be replaced by a single RC filter with accurate timing and sampling. More details about such an oscillator may be found in Vishinsky, U.S. Pat. No. 7,400,212 B1, entitled "Self-Tuned Active Bandpass Filters", issued Jul. 15, 2008.

The disadvantages of this prior art filter may include: (1) a need for an accurate reference clock or the presence of a received signal (see Lane, U.S. Pat. No. 3,978,420, entitled "Self-Tuning Filters", issued Aug. 31, 1976; Deboo et al., U.S. Pat. No. 3,714,588, entitled "Self-Tuning Bandpass Filter", issued Jan. 30, 1973); (2) the need for additional circuitry, such as the RC-oscillator 103, the frequency comparator 105 and/or the state machine 107; (3) during a calibration cycle, oscillator clock feed-through may occur and/or additional startup time may be required for calibration and additional power to run the calibration; (4) if the RC filter needs to be tuned to another frequency, the reference frequency may need to be changed; (5) complicated reference frequency circuitry may be required in case many different frequencies need to be set; (6) each time the filter is tuned to a new frequency, calibration may need to be done; and (7) in case calibration is done using a received signal, it may require the signal to be present (see Lane, U.S. Pat. No. 3,978,420, entitled "Self-Tuning Filters", issued Aug. 31, 1976; Deboo et al., U.S. Pat. No. 3,714,588, entitled "Self-Tuning Bandpass Filter", issued Jan. 30, 1973) and it may require settling time to for the filter to be tuned accurately.

Figure 2:
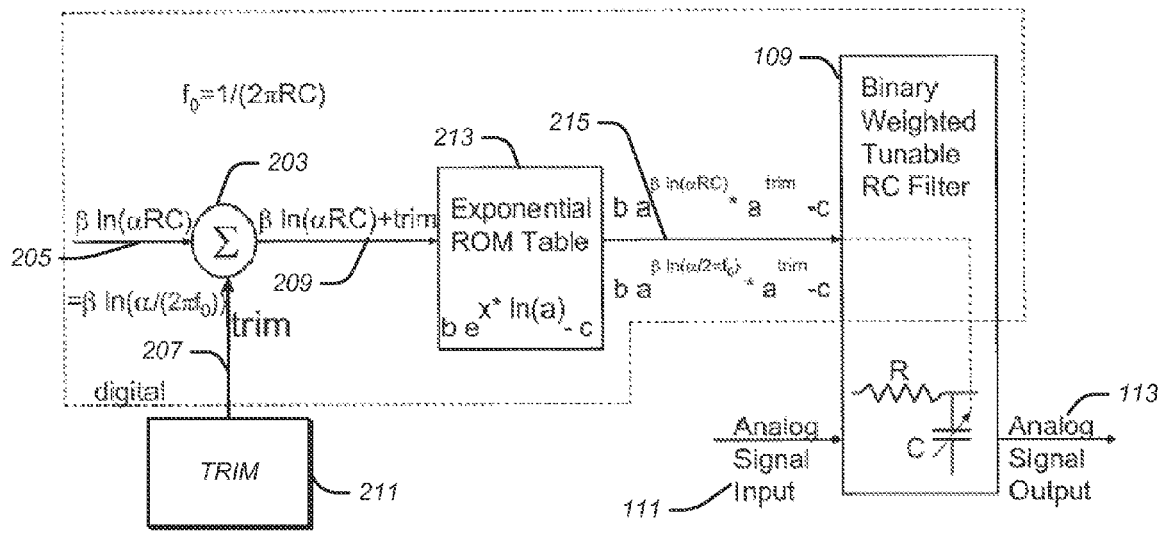
FIG. 2 illustrates an example of a tunable and trimmable analog filter of the RC type that uses only a single trim value to compensate for variations in component values over the entire tunable frequency range.

FIG. 2 illustrates an example of a tunable and trimmable analog filter of the RC type that uses only a single trim value to compensate for variations in component values over the entire tunable frequency range. The tunable and trimmable analog filter may have a summer 203 having summing inputs 205 and 207 and a summed output 209, a non-volatile memory 211 containing a single fixed trim value that is delivered to the summing input 207, a non-volatile memory 213 which may be a ROM containing an exponential table and having an output 215, the binary weighted tunable RC filter 109, and the analog signal input 111 to and the analog signal output 113 from the binary weighted tunable RC filter 109. All of the circuitry may be digital, except the RC filter between the analog signal input 111 and the analog signal output 113. All of the components may be on the same or different chips. When on the same chip, all of the resistors and capacitors may be subject to substantially the same process variations during manufacture.

The summer 203 may receive tuning information indicative of a desired frequency for the cutoff of the tunable analog filter at the summing input 205. This tuning information may be a factor times the natural logarithm of the reciprocal of the center frequency based on the following equation:

$$\text{Tuning information} = \beta^* \ln(\alpha/(2\pi f_o)) = \beta^* \ln(\alpha^* RC)$$

Where $f_o$ is the desired center frequency and $\alpha$ and $\beta$ are constants.

The summer 203 may sum this tuning information with the single fixed trim value contained within the non-volatile memory 211 and deliver the sum at its summed output 209 to the input of the memory 213.

The exponential table in the memory 213 may be configured to output a value that is an exponential function of the input to the memory 213, such as the following exponential function:

$$b^* e^{X^* \ln(a)} - c$$

where a, b, and c are constants. The output of the memory 213 may be delivered as the digital tuning signal to the digital signal input 215 of the binary weighted tunable RC filter 109, thus causing the RC network within the binary weighted tunable RC filter 109 to be tuned to this value. The digital tuning signal, for example, may specify a numeric value indicative of a desired capacitance in the RC network, such as the number of unit capacitors to be connected in an array.

The value of the trim in the memory 211 may be individually set for each instance of the tunable and trimmable analog filter that is manufactured. This value may be embedded in the memory 211 by, for example, burning fuses within the memory 211 when the memory 211 has such fuses. The value may be determined based on a test of each individual instance of the binary weighted tunable RC filter 109 after it is produced at the factory.

For each instance of the binary weighted tunable RC filter 109, for example, the value may be an amount that is determined by the test to be needed to trim the instance of the tuning information to a value that causes the RC filter within the binary weighted tunable RC filter 109 to be precisely tuned to the frequency indicated by the instance of tuning information, notwithstanding deviations in one or more values of the RC network from their specified values caused by deviations in the process of manufacturing the binary weighted tunable RC filter 109.

Factory calibration may be done by providing a stimulus on the analog signal input 111 and by monitoring the analog signal output 113. The trim value can then be adjusted until the analog signal output 113 indicates that the binary weighted tunable RC filter 109 is tuned to the precise frequency specified by the tuning information. The digital circuitry can be programmed via an SPI (serial port) or other digital interface in such a way that the desired output signal is obtained. Fuses in the memory 211 can then be programmed to the determined trim value. This tuning process can be done, for example, during wafer sort. The trim value can be obtained by subtracting the optimum pre-trim cut-off frequency setting with the desired cut-off frequency setting.

In an alternate embodiment, a single trim value may not be stored in the memory 211. Instead, the table in the memory 213 may be customized for each chip to contain data that includes a trim value for every possible input value. In this instance, an exponential table may not be needed and significantly more bits may be needed to be programmed in memory 213.

Figure 3:
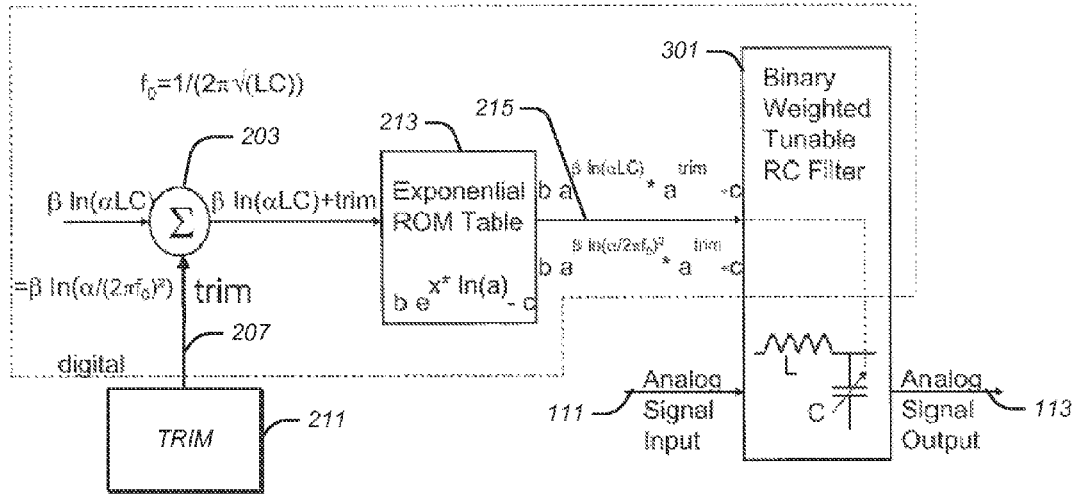
FIG. 3 illustrates an example of a tunable and trimmable analog filter of the LC type that uses only a single trim value to compensate for variations in component values over the entire tunable frequency range.

FIG. 3 illustrates an example of a tunable and trimmable analog filter of the LC type that uses only a single trim value to compensate for variations in component values over the entire tunable frequency range. The components of and input to this filter may be the same as those illustrated in FIG. 2, except that: (1) the tunable filter may be a binary weighted tunable LC filter 301; and (2) the tuning information received by the summer 203 may be a factor times the natural logarithm of the reciprocal of the center frequency squared based on the following equation:

Tuning information=$\beta^*\ln(\alpha/(2\pi f_o)^2)=\beta^*\ln(\alpha^*CL)$ where $f_0$ is the desired center frequency and $\alpha$ and $\beta$ are constants.

Figure 4:
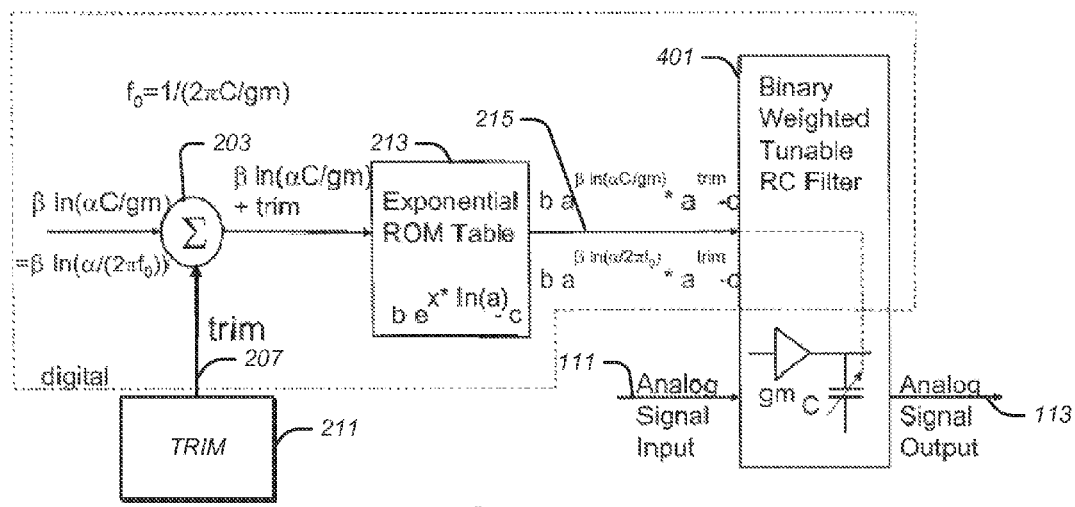
FIG. 4 illustrates an example of a tunable and trimmable analog filter of the C/gm type that uses only a single trim value to compensate for variations in component values over the entire tunable frequency range.

FIG. 4 illustrates an example of a tunable and trimmable analog filter of the C/gm type that uses only a single trim value to compensate for variations in component values over the entire tunable frequency range. The components of and input to this filter may be the same as those illustrated in FIG. 2, except that: (1) the tunable filter may be a binary weighted tunable C/gm filter 401; and (2) the tuning information received by the summer 203 may be a factor times the natural logarithm of the reciprocal of the center frequency based on the following equation:

Tuning information=$\beta^*\ln(\alpha/(2\pi f_o))=\beta^*\ln(\alpha^*C/gm)$ where $f_0$ is the desired center frequency and $\alpha$ and $\beta$ are constants.

Figure 5:
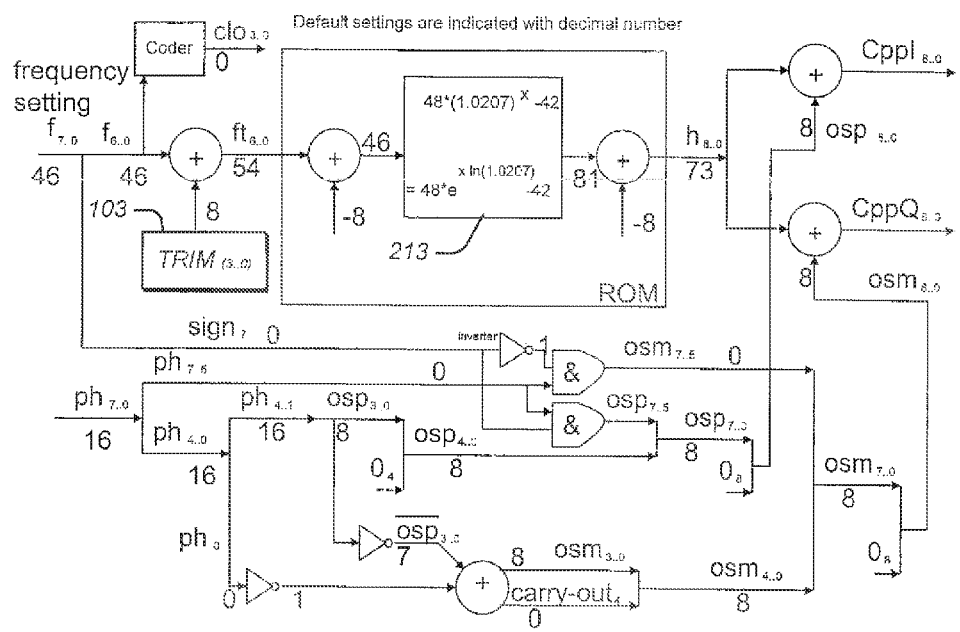
FIG. 5 illustrates an example of a tunable and trimmable analog filter of the poly-phase type that uses only a single trim value to compensate for variations in component values over the entire tunable frequency range.

FIG. 5 illustrates an example of a tunable and trimmable analog filter of the poly-phase type that uses only a single trim value to compensate for variations in component values over the entire tunable frequency range. A poly-phase tunable analog filter (omitted from the figure) may have a CppI input that receives a CppI digital tuning signal that causes the frequency of a CppI characteristic of the tunable analog filter to be set by the CppI digital tuning signal that is indicative of the frequency of the characteristic. The poly-phase tunable analog filter may also have a CppQ input that receives a CppQ digital tuning signal that causes the frequency of a CppQ characteristic of the tunable analog filter to be set by the CppQ digital tuning signal that is indicative of the frequency of the characteristic. Having different digital tuning signals CppI and CppQ allows for a phase tuning described in the patent application "Poly-Phase Filter with Phase Tuning," Apr. 17, 2013, application 61/813,077.

The trimming circuit may otherwise have comparable components and operate in comparable ways as the tunable and trimmable analog filter of the RC type illustrated in FIG. 2. For example, the trimming circuit may generate the CppI and the CppQ digital tuning signals by trimming the tuning information to compensate for the deviations in component value and by using the data contained within the memory 213 that contains the trim value and the memory 213 that contains the exponential table. In FIG. 5 all signals may be digital. Subscripts in the figure indicate the number and position of bits that represent data such as "7 . . . 0" which means an 8 bit bus, from bit 0 to bit 7.

The lower portion of the circuitry illustrated in FIG. 5 may be used for phase adjustment of the poly phase filter. Details about such adjustment circuitry may be found in the following patent applications: "Balun Mixing Circuit," filed Oct. 24,2013, application Ser. No. 14/061,479, and "Poly-Phase Filter With Phase Tuning," filed Apr.17, 2013, application 61/813,077

The accuracy of the filter tuning of the circuits illustrated in FIGS. 2-5 can be limited by:

1) Temperature and supply voltage shifts. Since the trim is fixed at a certain operating point, any frequency shifts due to, for example temperature and supply voltage, may not be tracked. Therefore, it may be useful to use filter components with minimum shift vs temperature and supply voltage.
2) Truncation error. The (digital) resolution of the trim and the resolution of the capacitor array can limit the optimum set point. Providing sufficient resolution can minimize this error.
3) Deviations of the center frequency of the filter as function of the capacitor array value. For example, of the analog RC filter: $f_o=1/(2\pi R(C_{array}+C_{fixed}+C_{par}))$ with $f_o$ the center or cut-off frequency of the filter, $C_{array}$ the value of the capacitor array, $C_{fixed}$ the fixed minimum value of the capacitor array, and $C_{par}$ the parasitic capacitance of the capacitor array. Deviations from this formula can be incorporated in the exponential ROM table to improve accuracy.

Possible features:
1) Trimming may be done in the factory by blowing or not blowing fuses. Since the trimming is already done, it doesn't need a frequency reference anymore.
2) Since trimming is already done, it may not need an RC-Oscillator, frequency comparator, or state machine.
3) Since trimming is already done, no time may be needed for calibration and no power may be used.
4) A frequency-agile trim may be achieved using an exponential ROM table trimming.

By adding the trim value up to the desired frequency setting before the exponent, the trim value may appear as a multiplication factor after the exponent and therefore may shift the RC time constant (or the LC or C/gm time constant) by the same multiplication factor, regardless of the frequency setting.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A tunable and trimmable analog filter comprising:
a tunable analog filter that:
sets the frequency of a characteristic of the tunable analog filter based on a digital tuning signal that is indicative of a desired frequency of the characteristic; and
contains components having values that deviate from specified values due to variations during manufacture of the tunable analog filter, the value deviations causing the frequency of the characteristic not to precisely match the frequency indicated by the digital tuning signal; and
a trimming circuit that:
includes a non-volatile memory that contains data;
receives tuning information indicative of a desired frequency for the characteristic of the tunable analog filter; and
generates the digital tuning signal by trimming the tuning information to compensate for the deviations in component value and by using the data contained within the non-volatile digital memory,
wherein:
the non-volatile digital memory includes an input and an output and wherein the data causes the output to substantially be an exponential function of its input, or
the tunable analog filter is an RC filter and the tuning information is based on the natural logarithm of a constant divided by the desired frequency, or
the tunable analog filter is a gm/C filter and the tuning information is based on the natural logarithm of a constant divided by the desired frequency, or
the tunable analog filter is a poly-phase tunable analog filter, the poly-phase tunable analog filter has a CppI input that receives a CppI digital tuning signal that causes the frequency of a CppI characteristic of the tunable analog filter to be set by the CppI digital tuning signal that is indicative of the frequency of the characteristic and a CppQ input that receives a CppQ digital tuning signal that causes the frequency of a CppQ characteristic of the tunable analog filter to be set by the CppQ digital tuning signal that is indicative of the frequency of the characteristic; and the trimming circuit generates the CppI and the CppQ digital tuning signals by trimming the tuning information to compensate for the deviations in component value and by using the data contained within the non-volatile digital memory.

2. The tunable/trimmable analog filter of claim 1 wherein the characteristic of the tunable analog filter is a frequency cutoff point.

3. The tunable/trimmable analog filter of claim 1 wherein the characteristic of the tunable analog filter is a center frequency.

4. The tunable/trimmable analog filter of claim 1 wherein the non-volatile digital memory includes an input and an output and wherein the data causes the output to substantially be an exponential function of its input.

5. The tunable and trimmable analog filter of claim 4 wherein the trimming circuit includes a summer that sums the tuning information with a fixed trim value.

6. The tunable and trimmable analog filter of claim 5 wherein the non-volatile digital memory is a first non-volatile memory and the trimming circuit includes a second non-volatile digital memory containing the fixed trim value.

7. The tunable and trimmable analog filter of claim 6 wherein the fixed trim value is frequency-independent.

8. The tunable and trimmable analog filter of claim 6 wherein the second non-volatile digital memory has burnable fuses and the fixed trim value is represented by the states of the burnable fuses.

9. The tunable and trimmable analog filter of claim 5 wherein the summer has an output whose value is delivered to the input of the first non-volatile digital memory.

10. The tunable and trimmable analog filter of claim 9 wherein the first non-volatile digital memory does not contain data that includes a trim value for every possible input value.

11. The tunable and trimmable analog filter of claim 1 wherein the non-volatile digital memory contains data that includes a trim value for every possible input value.

12. The tunable and trimmable analog filter of claim 1 wherein the tunable analog filter is an RC filter.

13. The tunable and trimmable analog filter of claim 12 wherein the tuning information is based on the natural logarithm of a constant divided by the desired frequency.

14. The tunable and trimmable analog filter of claim 1 wherein the tunable analog filter is an LC filter.

15. The tunable and trimmable analog filter of claim 14 wherein the tuning information is based on the natural logarithm of the square of the result of a constant divided by the desired frequency.

16. The tunable and trimmable analog filter of claim 1 wherein the tunable analog filter is a gm/C filter.

17. The tunable and trimmable analog filter of claim 16 wherein the tuning information is based on the natural logarithm of a constant divided by the desired frequency.

18. The tunable and trimmable analog filter of claim 1 wherein the tunable analog filter is a binary-weighted tunable analog filter.

19. The tunable and trimmable analog filter of claim 1 wherein the tunable analog filter is a poly-phase tunable analog filter.

20. The tunable and trimmable analog filter of claim 19 wherein:
the poly-phase tunable analog filter has a:
CppI input that receives a CppI digital tuning signal that causes the frequency of a CppI characteristic of the tunable analog filter to be set by the CppI digital tuning signal that is indicative of the frequency of the characteristic; and
a CppQ input that receives a CppQ digital tuning signal that causes the frequency of a CppQ characteristic of the tunable analog filter to be set by the CppQ digital tuning signal that is indicative of the frequency of the characteristic;
and
the trimming circuit generates the CppI and the CppQ digital tuning signals by trimming the tuning information to compensate for the deviations in component value and by using the data contained within the non-volatile digital memory.

21. Multiple tunable and trimmable analog filters, each containing the same circuitry and comprising:
a tunable analog filter that:
sets the frequency of a characteristic of the tunable analog filter based on a digital tuning signal that is indicative of the frequency of the characteristic; and
contains components having values that vary from specified values due to variations during manufacture of the tunable analog filter, the value deviations causing the frequency of the characteristic not to precisely match the frequency indicated by the digital tuning signal; and
a trimming circuit that:
includes a first non-volatile digital memory that includes an input and an output and contains data that causes the output to substantially be an exponential function of its input;
includes a second non-volatile digital memory containing a fixed trim value;
receives tuning information indicative of a desired frequency for the characteristic of the tunable analog filter;
generates the digital tuning signal by trimming the tuning information to compensate for the deviations in component value based on the tuning information, the fixed trim value, and the data contained within the first non-volatile digital memory,
wherein:
the data in each of the first non-volatile digital memories is the same; and
the fixed trim value in each of the second non-volatile digital memories is different.

* * * * *

UNITED STATES PATENT AND TRADEMARK OFFICE
CERTIFICATE OF CORRECTION

PATENT NO.       : 9,306,531 B2
APPLICATION NO.  : 14/199839
DATED            : April 5, 2016
INVENTOR(S)      : Petrus Martinus Stroet It is certified that error appears in the above-identified patent and that said Letters Patent is hereby corrected as shown below:

In the claims,

At col. 8, lines 43-44,

> "of the frequency of the characteristic; and the trimming circuit generates the Cpp1 and the CppQ digital"

should read

> --"of the frequency of the characteristic; and the trimming circuit generates the CppI and the CppQ digital"--

Signed and Sealed this
Twenty-eighth Day of June, 2016

Michelle K. Lee
*Director of the United States Patent and Trademark Office*